(12) United States Patent
Derbyshire et al.

(10) Patent No.: US 7,880,466 B2
(45) Date of Patent: *Feb. 1, 2011

(54) SPECTRALLY SELECTIVE SUPPRESSION WITH STEADY-STATE FREE PRECESSION

(75) Inventors: John Andrew Derbyshire, Silver Spring, MD (US); Daniel Alfredo Herzka, Rockville, MD (US); Elliot R. McVeigh, Phoenix, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 646 days.

This patent is subject to a terminal disclaimer.

(21) Appl. No.: 11/751,479

(22) Filed: May 21, 2007

(65) Prior Publication Data

US 2007/0225591 A1 Sep. 27, 2007

Related U.S. Application Data

(63) Continuation of application No. 11/075,415, filed on Mar. 8, 2005, now Pat. No. 7,253,620.

(60) Provisional application No. 60/551,273, filed on Mar. 8, 2004.

(51) Int. Cl.
*G01V 3/00* (2006.01)

(52) U.S. Cl. ...................... 324/307; 324/309
(58) Field of Classification Search .................. 324/307, 324/309
See application file for complete search history.

(56) References Cited

U.S. PATENT DOCUMENTS

| 6,339,332 B1 | 1/2002 | Deimling .................... 324/309 |
| 6,456,071 B1 | 9/2002 | Hennig ....................... 324/307 |
| 7,020,509 B2 | 3/2006 | Heid ........................... 600/410 |
| 7,253,620 B1 | 8/2007 | Derbyshire et al. ......... 324/307 |
| 7,587,231 B2 * | 9/2009 | Zhang ........................ 600/410 |

OTHER PUBLICATIONS

Carr, H.Y., "Steady-state free precession in nuclear magnetic resonance," Phys. Rev., 1958, 112(1), 7 pages of photographs, 1693-1701.

Crawley, A.P., et al., "Elimination of transverse coherences in FLASH MRI," Magn. Reson. Med., 1988, 8, 248-260.

Darrasse, L., et al., "Spoiling techniques in very fast TR imaging," in Proc. $7^{th}$ Annual meeting SMRM, Book of Abstracts, 1988, vol. 2, p. 611.

Deimling, M., et al., "Magnetization prepared true FISP imaging," in Proc. $2^{nd}$ Annual Meeting SMRM, 1994, vol. 1, 495.

(Continued)

*Primary Examiner*—Louis M Arana
(74) *Attorney, Agent, or Firm*—Edwards Angell Palmer & Dodge LLP; Peter F. Corless; Christine C. O'Day

(57) ABSTRACT

A method for fat-suppressed imaging is disclosed. Such a method may include storing a first spectral component of an echo signal formed at TR/2 from a sample, suppressing a second spectral component of the echo signal at TR/2, re-exciting the stored spectral component after suppressing the second spectral component, and producing an image of the sample based on the re-excited stored spectral component.

18 Claims, 11 Drawing Sheets

OTHER PUBLICATIONS

Derbyshire, J.A., et al., "Gromit: A SSFP imaging sequence employing hardware optimized gradients and just-in-time waveforem synthesis," in Proc. 10th Annual Meeting ISMRM, 2002, p. 2359.

Deshpande, V., et al., "Reduction of transient signal oscillations in True-FISP using a linear flip angle series magnetization preparation," Magn. Reson. Med., 2003, 49(1), 151-157.

Deshpande, V.S., et al., "3D magnetization-prepared true-FISP: A new technique for imaging coronary arteries," Magn. Reson. Med., 2001, 46, 494-502.

Flamm, S.D., et al., "Coronary artery magnetic resonance angiography," J. Magn. Reson. Imag., 2004, 19, 686-709.

Hardy, C.J., et al., "Steady-state precession imaging with inherent fat suppression," in Proc. 10th Annual Meeting ISMRM, 2002, p. 473.

Hargreaves, B.A., et al., "Fat-suppressed steady-state free precession imaging using phase detection," Magn. Reson. Med., 2003, 50, 210-213.

Hennig, J., et al., "Optimization of signal behavior in the transition to driven equilibrium in steady-state free precession sequences," Magn. Reson. Med., 2002, 48(5), 801-809.

Herzka, D.A., et al., "Myocardial tagging with SSFP," Magn. Reson. Med., 2003, 49, 329-340.

Kellman, P., et al., "Adaptive sensitivity encoding incorporating temporal filtering (TSENSE)," Magn. Reson. Med., 2001, 45, 846-852.

Morris, H.D., et al., "A wideband multi-channel digital receiver and real-time reconstruction engine for use in a clinical MR scanner," in Proc. 10th Annual Meeting ISMRM, 2002, p. 61.

Oppelt, A., et al., "FISP—A new fast MRI sequence," Electromedica, 1986, 54(1), 15-18.

Overall, W.R., et al., "Steady-state sequence synthesis and its application to efficient fat-suppressed imaging," Magn. Reson. Med., 2003, 50, 550-559.

Pruessmann, K.P., et al., "Sensitivity encoding fro fast MRI," Magn. Reson. Med., 1999, 42, 952-962.

Reeder, S.B., et al., "Multicoil Dixon chemical species separation with an interative least-squares estimation method," Magn. Reson. Med., 2004, 51, 35-45.

Santos, J.A., et al., "Real-time fat suppressed SSFP," in Proc. 11th Annual Meeting ISMRM., 2003, p. 982.

Scheffler, K., et al., "Magnetization preparation during the steady state: fat-saturated 3D TrueFISP," Magn. Reson. Med., 2001, 45, 1075-1080.

Scheffler, K., et al., "Is TrueFISP a gradient-echo or a spin-echo sequence?," Magn. Reson. Med., 2003, 49(2), 395-397.

Sekihara, K., "Steady-state magnetizations in rapid NMR imaging using small flip angles and short repetition intervals," IEEE Trans. Med. Imag., 1987, MI6(2), 157-164.

Vasanawala, S., et al., "Fluctuating equilibrium MRI," Magn. Reson. Med., 1999, 42, 876-883.

Vasanawala, S., et al., "Linear combination steady-state free precession MRI," Magn. Reson. Med., 2000, 43, 82-90.

Zur, Y., et al., "Elimination of the steady-state transverse magnetization in short TR imaging," in Proc. 6th Annual Meeting SMRM, Book of Abstracts, 1987, vol. 1, p. 440.

Zur, Y., et al., "Spoiling of transverse magnetization in steady-state sequences," Magn. Reson. Med., 1991, 21, 251-263.

Zwanenburg, J.J.M., et al., "Steady-state free precession with myocardial tagging: CSPAMM in a single breathhold," Magn. Reson. Med., 2003, 49, 722-730.

U.S. Appl. No. 60/551,273, filed Mar. 8, 2004.

* cited by examiner

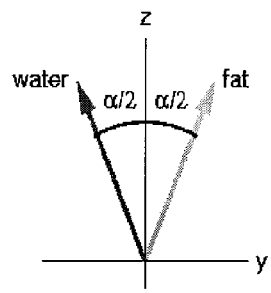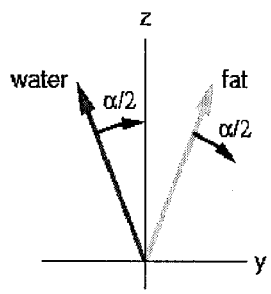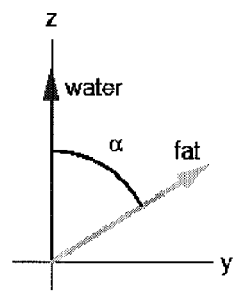
FIG. 2A  FIG. 2B  FIG. 2C  FIG. 2D
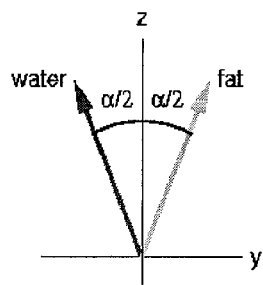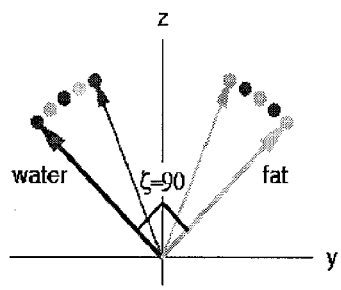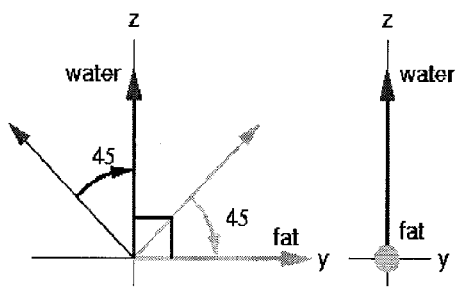
FIG. 3A  FIG. 3B  FIG. 3C  FIG. 3D Conventional FISP: ·········
S⁵FP without RF spoiling: ─────
S⁵FP with RF spoiling: ─────

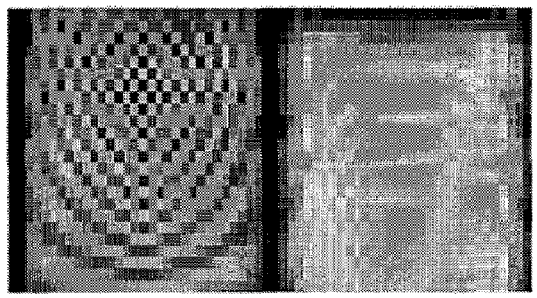
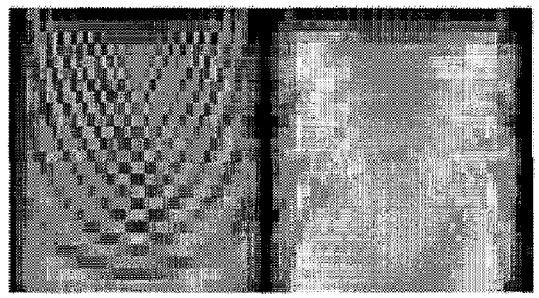
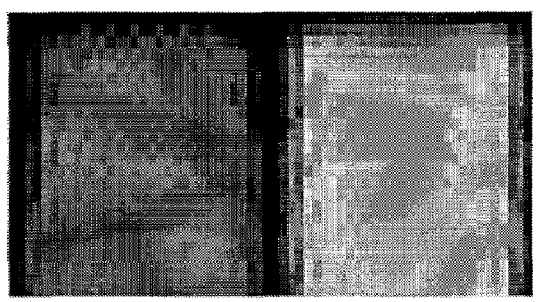
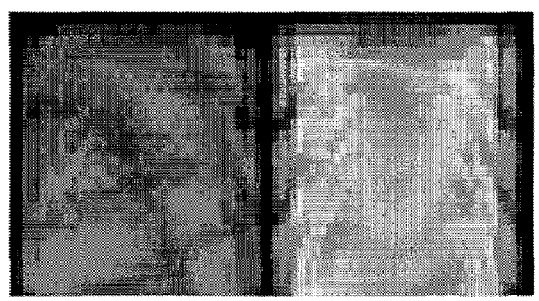
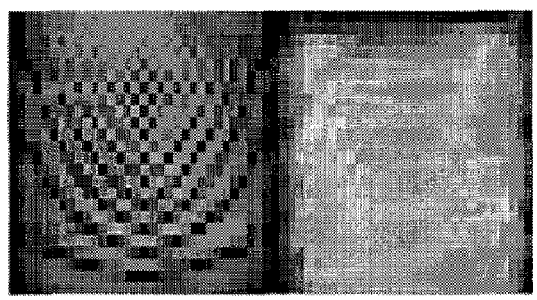
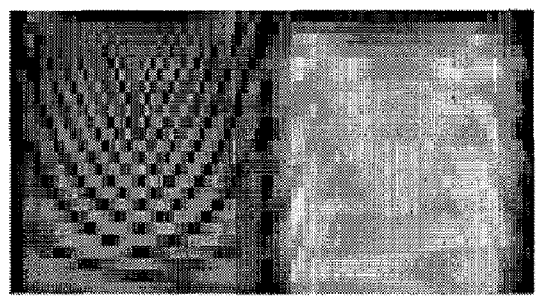
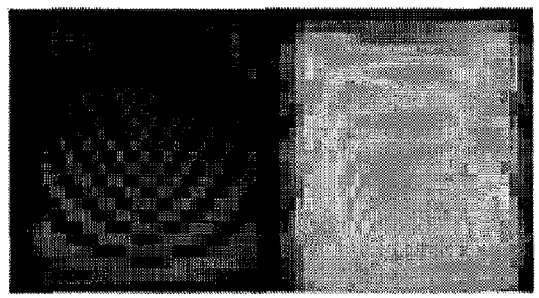
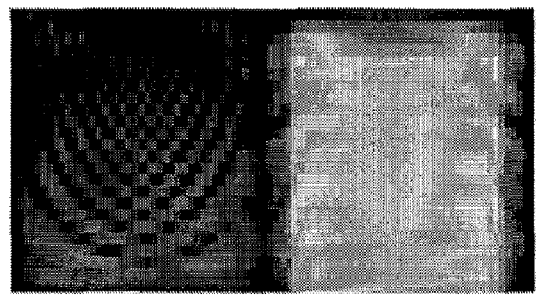
FIG. 6A          FIG. 6B

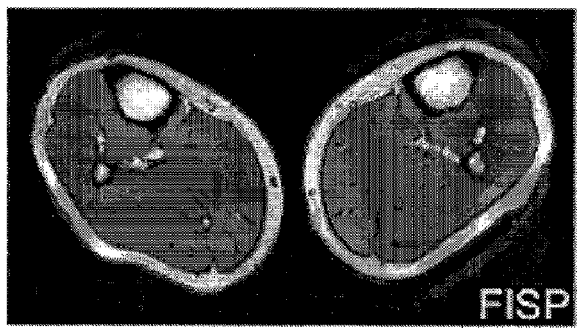
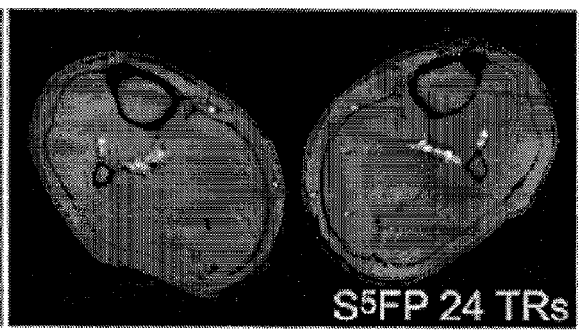
FIG. 10A          FIG. 10B
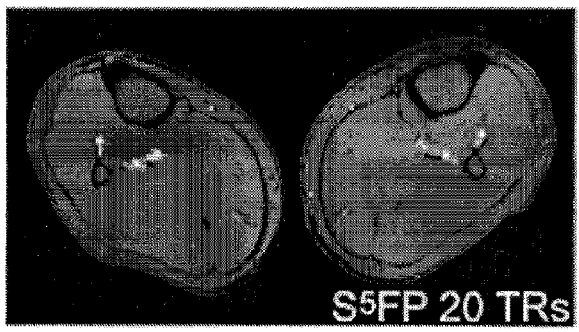
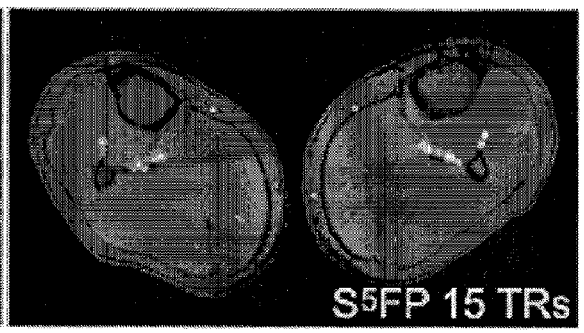
FIG. 10C          FIG. 10D
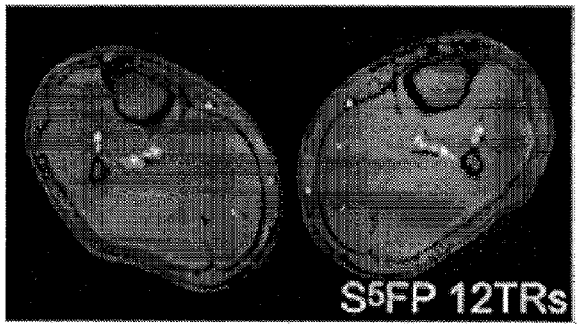
FIG. 10E          FIG. 10F even # US 7,880,466 B2

SPECTRALLY SELECTIVE SUPPRESSION WITH STEADY-STATE FREE PRECESSION

CROSS-REFERENCE TO RELATED APPLICATIONS

This application is a continuation of U.S. patent application Ser. No. 11/075,415, filed Mar. 8, 2005, now U.S. Pat. No. 7,253,620, which application claims the benefit under 35 U.S.C. §119(e) of provisional U.S. patent application No. 60/551,273, filed Mar. 8, 2004, the contents of which are incorporated herein by reference.

FIELD OF THE INVENTION

Generally, the invention relates to magnetic resonance imaging. More particularly, the invention relates to systems and methods that employ the inherent spectral selectivity of the steady-state free precession (SSFP) pulse sequence to provide a spectral band of suppression.

BACKGROUND OF THE INVENTION

Recently, there has been much interest in the imaging sequence known as fast imaging with steady state precession (FISP). FISP is an imaging sequence that employs balanced steady-state free precession (SSFP), thereby recycling the magnetization, and providing a high signal-to-noise ratio (SNR) that is practically independent of the sequence repetition time TR. As used herein, the term SSFP refers to the general NMR phenomenon of steady-state free precession, and the term FISP refers to an SSFP imaging sequence with fully balanced gradients in each TR.

Fat, especially subcutaneous tissue, generates large signals. These can be a source of artifacts such as Gibbs ringing, and may interfere with the signals of interest by partial volume effects or by obscuring the origin of the signal (e.g., blood). For many practical implementations, the TR of the FISP sequence is such that the contributions of fat in the image are phased-opposed to those of water, leading to destructive interference in pixels with partial volumes of water and fat. Also, methods requiring a reference image (e.g., SENSE) can be corrupted by large fat signals. Fat surrounding the coronary arteries is also detrimental in coronary artery imaging (CAI) since it can obscure the artery or confound signal from contrast-enhanced blood. It is, therefore, often desirable to suppress the contribution of fat signals in the image.

Most common fat attenuation methods rely on the differing evolution of water and fat by, e.g., frequency or relaxation. They thus require significant evolution time to perform selective suppression, and are generally only effective during a limited time-window at a specific delay after application. More recently, methods have been proposed for performing fat suppression or fat/water separations specifically during FISP acquisitions. These methods require phase-cycling or multiple acquisitions, at least doubling the scan time, and are therefore non-ideal for use with real-time imaging. A single acquisition, phase-based postprocessing method has been proposed, but this approach identifies whole voxels as either fat or water and hence will suffer from partial volume effects.

It would be desirable, therefore, if there were available systems and methods that provide significant attenuation of fat-based signal while maintaining the preferred signal level for water-based tissues provided by standard FISP.

SUMMARY OF THE INVENTION

An idealized SSFP sequence generates echo signals at approximately half the pulse repetition interval, i.e., TR/2, between RF pulses. Such echoes differ from conventional spin echoes in that such echo signals may have both positively and negatively phased spectral components. Isochromats that precess an approximately even number of cycles during the pulse repetition interval, TR, yield echoes in-phase with on-resonance isochromats, and vice versa. Accordingly, water and fat isochromats may be partitioned into respective spectral components. For example, as fat has a chemical shift of 3.3 ppm (210 Hz at 1.5 T), an SSFP sequence with 2.4<TR<7.1 ms generates echoes with fat in anti-phase to water. Consequently, when the scanner is set on-resonance for water, an SSFP sequence with 2.4 ms<TR<7.1 ms will generate an echo at the TR/2 timepoint with fat signals that are phase-opposed to those from water. Chemical shift increases linearly with field strength, giving a fat/water separation of approximately 420 Hz at 3 T. Accordingly, fat and water will be phase-opposed for 1.2<TR<3.6 ms and 5.9<TR<8.3 ms.

According to the invention, to effect separation, the FISP sequence may be divided into a plurality of relatively short SSFP-trains. Each SSFP-train may include a plurality of RF pulses, for example, 8 to 64 RF pulses. Between successive SSFP-trains, the water isochromats may be z-stored. Residual transverse magnetization, including spins that were phased-opposed to the on-resonance water, may then be gradient-crushed and RF-spoiled, by changing the scanner exciter and receiver phase, for example. The stored magnetization may then be re-excited using, for example, a linearly ramped opening sequence method or an α/2-TR/2 opening sequence method, with very little disturbance to the steady-state water signal.

It has been found that the additional time required to play the sequence may be about 1-2 $T_R$s, which does not significantly affect imaging efficiency. To effect greater suppression, the flip angle may also be ramped up, to 90°, for example, just before the end of the SSFP-train. Considering each SSFP-train as a sequence unit, the effect on fat is similar to a conventional gradient- and RF-spoiled sequence. For water, there is no spoiling, and the sequence retains the SSFP qualities of FISP.

An improvement to the FISP imaging sequence that provides an efficient method for fat-suppression has been developed. The method avoids interrupting the SSFP steady state for a lengthy period while an explicit fat-saturation sequence is played out. The length of the SSFP-train is a parameter that may be considered in implementing the method. Preferably, the train should be short enough for gradient and RF-spoiling to be effective, and yet long enough for the fat/water isochromats to become properly phase opposed.

The method is particularly useful with continuous imaging methods. When image datasets are to be acquired using multiple SSFP-trains, phase-encoding steps can be interleaved between SSFP-trains, permitting view-shared imaging in which reconstruction frame rate exceeds true acquisition frame rate. The method is expected to work well in combination with magnetization preparation methods (e.g., inversion-recovery (IR) perfusion).

BRIEF DESCRIPTION OF THE DRAWINGS

FIGS. 2A-2D depict water and fat isochromats demonstrating an example embodiment of a fat suppression mechanism according to the invention.

FIGS. 3A-3D depict water and fat isochromats demonstrating another example embodiment of a fat suppression mechanism according to the invention using a ramped closing sequence.

FIGS. 6A and 6B provide a comparison of simulated and experimental response data.

FIGS. 10A-F provide a comparison of calf images acquired using conventional FISP and S$^5$FP sequences with various train lengths.

DETAILED DESCRIPTION OF ILLUSTRATIVE EMBODIMENTS

It has previously been shown that an SSFP sequence comprising a train of phase-alternated, α-flip angle RF pulses generate echo signal (similar to spin-echoes) at a time-point TE≈TR/2 from the mid-points of the RF pulses. Echoes generated under SSFP differ from conventional spin-echoes in that they may be formed with either positive or negative phase depending on the amount of precession experienced in each TR. Isochromats that precess approximately an even number of complete cycles in one TR form an echo in-phase with on-resonance isochromats, while those that precess approximately an odd number of cycles yield signal with opposing phase. That is, the echoes from isochromats with off-resonance frequency Δω satisfy:

$(2k)2\pi-\pi < \Delta\omega TR < (2k)2\pi+\pi \rightarrow$ positive echo signal, and $(2k+1)2\pi-\pi < \Delta\omega TR < (2k+1)2\pi+\pi \rightarrow$ negative echo signal, where k is an integer.

Figure 1:
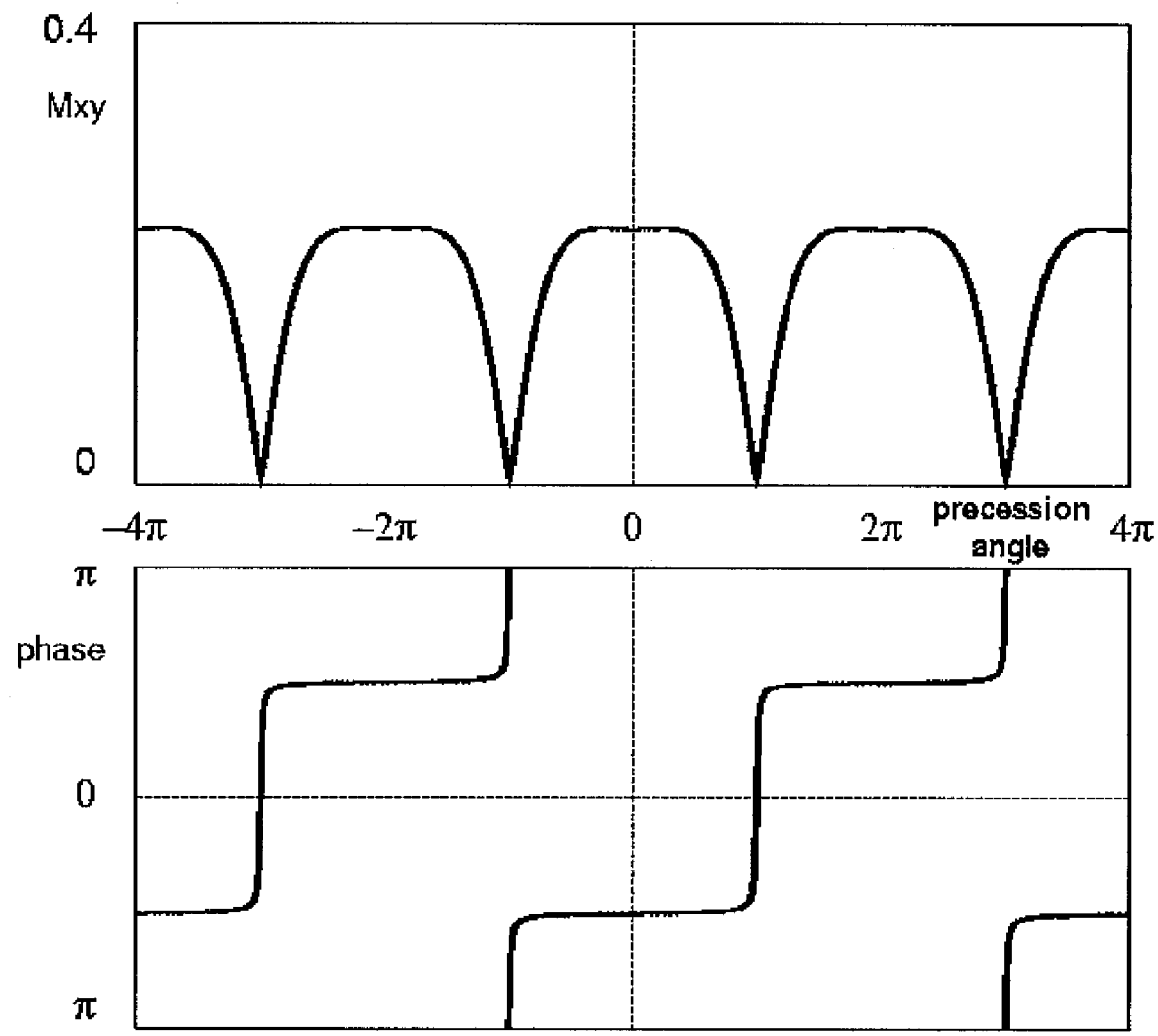
FIG. 1 depicts a simulated SSFP magnetization response.

This effect, shown in FIG. 1, allows the isochromats to be separated into two spectral components with a fairly sharp transition zone between the two bands. FIG. 1 depicts simulated SSFP magnetization response measured at TE=TR/2 as a function of off-resonance frequency, shown as the angle an isochromat precesses in TR, i.e., Θ=ΔωTR. The response shown in FIG. 1 was simulated at T1/T2=500/100 ms, TR=3.0 ms, and flip angle α=45° with 180° phase cycling between RF pulses. The magnitude response is partitioned into bands: the phase within each band is essentially constant representing the formation of an echo signal. Note, however, that adjacent bands are phase-shifted by π radians.

Thus, according to the invention, this inherent spectral selectivity may be exploited to provide water selection and fat suppression. For example, with a scanner center frequency (i.e., 0 Hz) set for water, fat (chemical shift=3.35 ppm) has a resonance frequency 214 Hz at 1.5 T, so any SSFP sequence with 2.3 ms<TR<7.0 ms will generate an echo at t=TR/2 with fat signal phase-opposed to those from water. It should be understood, however, that the invention may be generalized to provide alternate spectral separations.

FIGS. 2A-2D provide a YZ-plane view of water and fat isochromats demonstrating the fat suppression mechanism. FIG. 2A shows the relative positions of magnetization at the TR/2 echo time point. The separation of the isochromats into discrete positively and negatively phased components at TE provides an opportunity to manipulate the isochromats so as to suppress one component. As shown in FIG. 2B, the water magnetization is z-stored by application of the α/2 RF pulse. That is, an α/2 pulse at TE, referred to as the z-storing pulse, is played to rotate the water isochromats to lie along the z-axis. In addition to z-storing the water (or in-phase) isochromats, the pulse also has the effect of further flipping the fat (or phase-opposed) isochromats into the transverse plane so that they have an angle α with the z-axis. For typical FISP imaging parameters, α may range from about 30° to about 60°. The transverse component of the fat is then dephased by gradient crushing, as shown in FIG. 2C. As shown in FIG. 2D, the residual longitudinal component substantially reduced from the normal SSFP steady-state magnitude. Thus, the fat component is reduced in effective size.

As the water-fat separation angle, ζ, (i.e., the angle between the water and fat isochromats just prior to z-storage) is increased towards 90°, the residual longitudinal fat component (after z-storage and gradient crushing) may be reduced, and hence improved suppression may be achieved. In the sequence discussed above, ζ=α, the SSFP flip angle, so it is expected that the degree of suppression will increase with flip angle. However, it may be unfeasible to apply very large flip angles (e.g., α>60°) for the whole SSFP-train due to limitations on energy deposition and also because of undesirable effects on the overall image contrast.

An effective water-fat separation angle ζ>α may be achieved by employing a closing subsequence at the end of the SSFP-train comprising $N_{close}$ RF pulses with flip angle $$\text{flip}[i]=\alpha+(2i+1)(\zeta-\alpha)/2N_{close},$$

where $0 \leq i < N_{close}$ is the pulse index in the closing subsequence. The subsequence gradually increases the water-fat separation angle from α to ζ in uniform steps. In particular, employing ζ=90° should achieve significantly improved suppression which theoretically completely crushes the fat magnetization component.

FIGS. 3A-3D depict water and fat isochromats demonstrating another example embodiment of a fat suppression mechanism according to the invention using a ramped closing sequence. In FIG. 3A, the relative positions of magnetization at the TR/2 echo time are shown. FIG. 3B depicts the closing sequence linearly increasing the effective water-fat separation angle from α to ζ in 4 TRs. The effects of the closing subsequence are illustrated in FIG. 3B for ζ=90°. In FIG. 3C, the ζ/2 RF pulse is applied to effect z-storage of the water magnetization. Finally, in FIG. 3D, spoiling of the transverse magnetization reduces the effective size of the fat component.

Data collected during the closing sequence will provide increased signal levels due to the increased transverse component of the magnetization. Defining φ[i] to be the angle between the magnetization and the z-axis after the ith closing pulse, these data can be re-scaled to normal SSFP signal levels by multiplication by $\sin(\alpha/2)/\sin(\phi[i])$. For example during SSFP with $\alpha=45'$ the magnetization will lie at an angle 22.5° to the z-axis and water-fat separation of 45°. For $N_{close}=5$ and $\zeta=90°$, the following closing series may be obtained

| pulse index | SSFP | Closing Sequence | | | | |
|---|---|---|---|---|---|---|
| | $\alpha$ | 0 | 1 | 2 | 3 | 4 |
| flip angle | ±45.0° | ±49.5° | ±58.5° | ±67.5° | ±76.5° | ±85.5° |
| angle to z-axis: $\phi$ | 22.5° | 27° | 31.5° | 36° | 40.5° | 45° |
| water-fat angle: $\zeta$ | 45° | 54° | 63° | 72° | 81° | 90° | followed by a $\zeta/2=45°$ pulse played at the echo time that z-stores the water and fully excites the fat magnetization.

Though the method described above causes the suppression of fat isochromats, the water isochromats, which were stored along the longitudinal axis, have a magnitude that is essentially unaffected by the closing sequence, apart from a small amount of $T_1$ relaxation. In restarting the SSFP-train, the opening sequence must rapidly separate the spectral components into in-phase and phase-opposed echoes without incurring a lengthy transition period.

An ($\alpha/2$-TR/2) combination is often used to restart SSFP sequences that have been interrupted to perform explicit magnetization preparation (e.g., tagging). However, this opening subsequence generates undesirable transient behavior from isochromats in the off-resonant bands, such as the fat discussed above. Even though signal from fat has been greatly suppressed, it may still be advantageous to start with a sequence with a smooth transition to steady-state. Opening subsequences employing a linearly ramped flip angle and full TR RF pulse separations have been proposed to provide a rapid separation of the fat and water components into phase-opposed echoes at TE. These are particularly effective where, as here, the fat isochromats have recently been nulled, and are growing back from very small magnitude. Excellent results may be obtained using as few as $N_{open}=5$ RF pulses:

flip[$i$]=(2$i$+1)$\alpha/2N_{open}$ which linearly increases the angle of magnetization from the z-axis. Data acquisition can begin with the first RF pulse and, similarly to the closing sequence, be rescaled to account for the use of lower excitation angles by multiplication by $\sin(\alpha/2)/\sin(\phi[i])$, where $\phi[i]=i\alpha/2N_{open}$, where the subsequence index i=0, . . . , $N_{open}$−1.

The incorporation of RF-spoiling between successive SSFP-trains provides further suppression of the unwanted spectral component. Generally, RF spoiling is extremely effective in reducing the coherence of transverse magnetization excited in one block with that in subsequent blocks of the sequence. The method is implemented by applying a linearly increasing phase increment to the RF transmitter and receiver between successive sequence blocks (typically the phase increment increases by 117° each block). For a conventional gradient echo imaging sequence, a block is one TR of the sequence. For the S⁵FP method, however, one block represents the duration of one train of SSFP pulses including their opening, closing, and z-storing subsequences. The interval between successive blocks should be less than the $T_2$ of the component to be suppressed, setting an upper bound on the SSFP-train duration.

Figure 4:
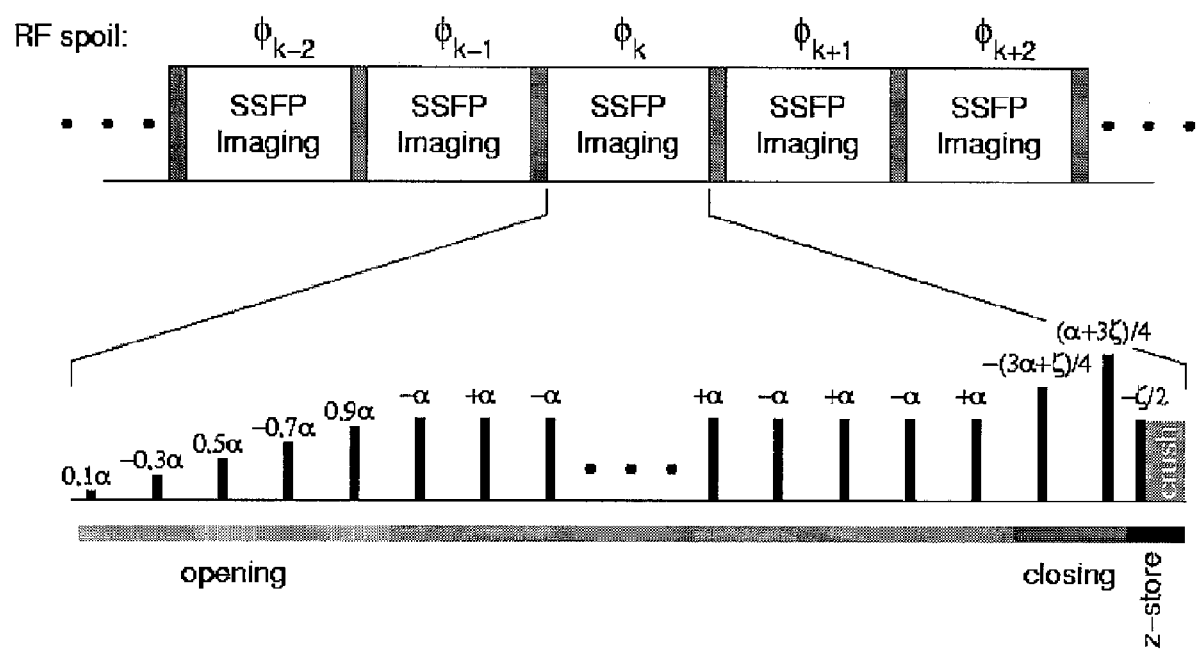
FIG. 4 depicts a spectrally selective suppression SSFP sequence.

The process of performing short SSFP-trains with intervening crushing and spoiling of the unwanted fat spectral component is repeated regularly to suppress re-growth of the fat signal over time. FIG. 4 summarizes the overall concept of the method, depicting an S⁵FP sequence with $N_{open}=5$ and $N_{close}=2$ RF pulses. The RF transmitter and receiver phase for a given short train relative to the preceding one is determined by standard RF spoiling methods: i.e., $\phi_k=\phi_{k-1}+k\phi_{spoil}$.

Simplistically, considering each whole SSFP-train to be a single repetition unit of the pulse sequence, the effect of the method on fat isochromats can be seen to be similar to that of a conventional RF-spoiled gradient echo sequence with flip angle $\zeta$ and TR equal to the duration of the entire SSFP-train. Water isochromats, which begin and end the train z-stored, are essentially immune to the large effective flip angle and the RF spoiling and retain the SSFP contrast of FISP. The acquisition and rescaling of data during the opening and closing sequences greatly improves the efficiency of the method, such that the only temporal overheads versus conventional FISP are those required for: SSFP echo formation at TE, the z-storage pulse, and the gradient crushing of residual magnetization, typically amounting to about 1 TR.

Computer simulations were performed to obtain the steady-state magnetization response as a function of off-resonance frequency. The performance of (i) standard SSFP; (ii) S⁵FP with gradient crushing applied between trains but RF spoiling disabled; and (iii) S⁵FP with both gradient crushing and RF spoiling were compared. Multiple isochromats ($N_{iso}$), each corresponding to a given off-resonance frequency, were tracked as the sequence played out. Individual RF pulses were treated as being hard pulses with instantaneous effect. Gradient crushing was simulated by following multiple ($N_{crush}$) coherence pathways with precession angles uniformly distributed over $-\pi \leq \theta < \pi$ and taking the mean over all the coherence pathways as the composite isochromat magnetization.

Parameters varied for simulation included (i) RF spoiling phase increment 0° (off) or 117° (on); (ii) the SSFP-train length; the number of RF pulses to be used for the (iii) opening and (iv) closing subsequences; and (v) the final water-fat angle, $\zeta$. Other simulation parameters corresponded to those typically employed in a 256-sample conventional FISP sequence: $\alpha=45°$, TR=3 ms and relaxation parameters for myocardial muscle (T1/T2=880/80 ms), arterial blood (T1/T2=1200/200 ms) and fat (T1/T2=250/80 ms) at 1.5 T. The magnetization response function was measured at the TE=TR/2, midway between the centers of the two adjacent RF pulses. To allow the magnetization to reach a steady state, the conventional SSFP sequence response was measured on the 1000th TR. To allow the variation of the response throughout the train to be examined, the S⁵FP response was measured for every TR during the 100th SSFP-train.

Experiments were performed using a 1.5 T GE Signa CV/i MRI scanner (GE Medical Systems, Waukesha, Wis.) equipped with gradients rated for 40 mT/m amplitude and 150 T/m/s slew rate. For parallel imaging (TSENSE) acquisitions employed in the cardiac studies, data were acquired using an 8-channel cardiac phased array coil (Nova Medical, Wilmington, Mass.) via an in-house constructed, external 8 channel receiver system. Experiments involving human volunteers were conducted with full consent under a protocol approved by the NHLBI institutional review board. The basic imaging pulse sequence was previously developed for efficient, continuous imaging with conventional FISP. This sequence was modified to perform S⁵FP imaging using multiple short SSFP-trains as described above. Sequence options included: the number of TRs in the short-train; the use of a ($\alpha/2$-TR/2) or ramped opening subsequence with specified numbers of RF pulses; the use of a ramped closing subsequence of particular length and $\zeta$ angle; and RF spoiling phase increment 0° (off) or 117° (on). In all cases, data acquisition was performed during both the ramped flip opening and closing subsequences. The additional temporal overhead for performing the sequence was exactly 1 TR per SSFP-train. Data resealing could optionally be performed during off-line data reconstruction.

To validate the simulations of the S$^5$FP response function, a sealed, 5 mm i.d. NMR tube was filled with 0.8 mM Gd-DTPA doped water and placed parallel to the magnet bore in the MRI system. A range of off-resonance frequencies were created by applying a fixed Z-shim offset. Non-phase encoded 1D-projections providing a frequency response similar to the simulations were obtained using the conventional FISP and S$^5$FP sequences. Data were acquired after the system reached steady-state. For the S$^5$FP sequence, data were acquired for each TR in the train to allow the variation of the response throughout the train to be examined. The effects of (i) enabling/disabling RF spoiling; varying (ii) the S$^5$FP-train length; the number of (iii) opening and (iv) closing pulses; and (v) the final water-fat angle, $\zeta$, were studied and compared to the simulation results.

Axial images of a human calf muscle were obtained to investigate the effects of the choice of train-length and final water-fat angle, $\zeta$, on the fat suppression. Images were obtained for conventional FISP and S$^5$FP using identical parameters: 1 ms, $\alpha$=45° flip angle RF pulses and 256 sample, ±125 kHz receiver bandwidth (RBW) acquisitions with TR=3.3 ms. Opening and closing subsequences comprised 5 RF pulses and 1 RF pulse respectively with gradient and RF-spoiling between trains. Images were acquired with 24 cm field-of-view (FOV) and 8 mm slice thickness with an acquisition matrix of 256×240. Various factorizations of the 240 phase encodes permitted S$^5$FP images to be formed by interleaving short-trains of different lengths. Signal intensity measurements were made on two separate muscle regions-of-interest (ROIs) and four fat ROIs. Twenty images were acquired sequentially and the last 10 were averaged to eliminate the transition into steady-state. Mean and standard deviation for both fat and water signals in the ROIs were recorded.

Ungated time series of cardiac images (similar to real-time imaging) were obtained using FISP and S$^5$FP with 8 mm slice thickness and FOVs of 36×27 cm (short axis) and 36×32.4 cm (long axis).

Identical imaging parameters were employed for both FISP and S$^5$FP: 1 ms, $\alpha$=45° flip RF pulses and 256 sample, ±125 kHz RBW with TR=3.2 ms. The full raw data matrix for each time-frame was 256×96. TSENSE parallel imaging provided acceleration rates R=3 and R=4 (i.e., 32 and 24 acquired phase encodes per image) for temporal resolutions of 102 ms and 77 ms respectively. Interleaving phase encodes for successive frames provided fully-sampled, lower temporal resolution coil maps. For example, the R=3 acquisition order is: [frame 0] 0, 3, 6, . . . ; [frame 1] 1, 4, 7, . . . ; [frame 2] 2, 5, 8, . . . ; etc., with a map being reconstructed from the combined data for frames 0, 1, and 2. Time series of 120 image frames (R=3) or 160 image frames (R=4) were collected for each sequence. For standard FISP imaging, the sequence ran without interruption with frame rates 13.0 fps and 9.8 fps respectively, corresponding to the temporal resolution. For the S$^5$FP sequence, each short-train corresponded exactly to one TSENSE image frame (i.e., 24 or 32 TRs) including subsequences comprising $N_{open}$=5 RF pulses and $N_{close}$=1 RF pulse with final water-fat angle, $\zeta$=90°. Z-storage and RF spoiling required a 1 TR overhead providing frame rates 12.5 fps and 9.5 fps (i.e., 96% and 97% efficient versus the FISP sequence) respectively.

Figure 5A:
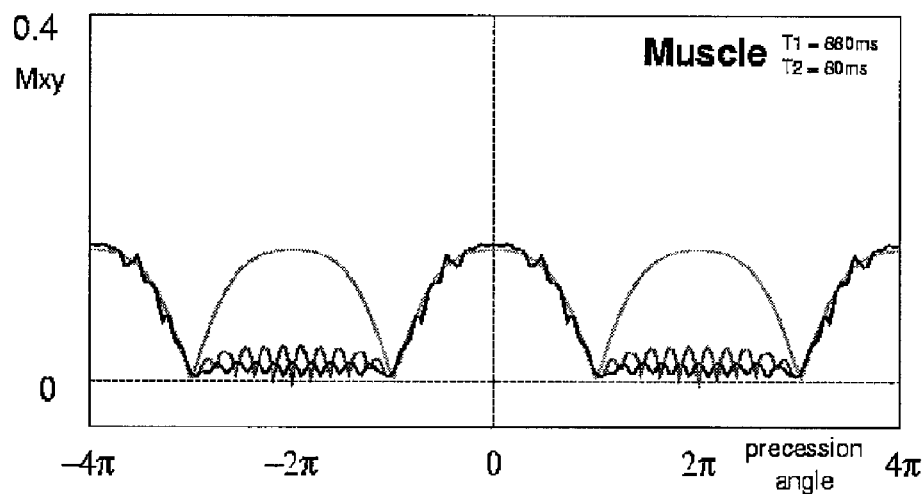
FIGS. 5A-C provide simulated magnetization responses as a function of off-resonance frequency for muscle, blood, and fat tissues, respectively.
Figure 5B:
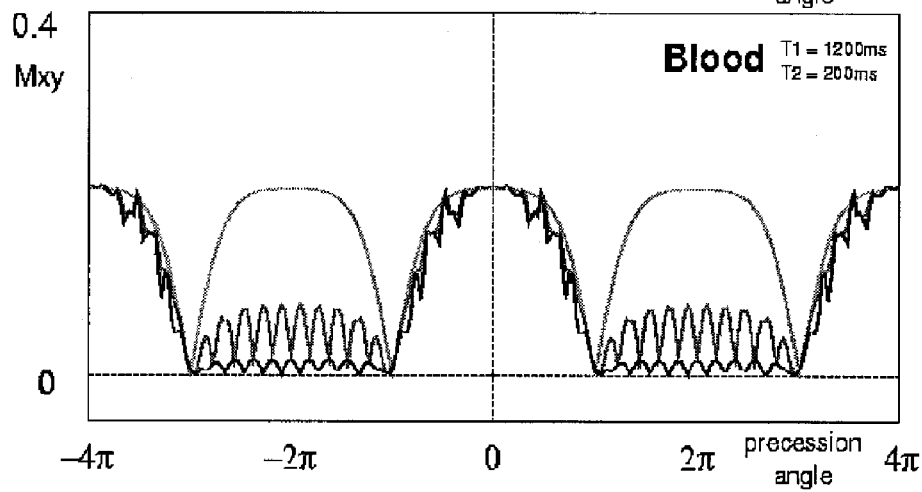
Figure 5C:
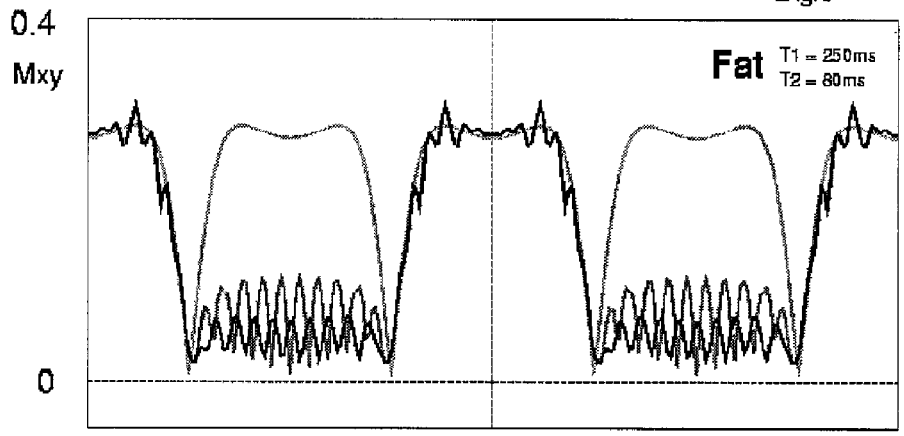

FIGS. 5A-5C show simulated magnetization responses (i.e., |Mxy| at TE=TR/2 as a function of the off-resonance precession angle) for conventional FISP and the proposed S$^5$FP sequence, with and without RF spoiling, for muscle, blood, and fat tissues, respectively. In all cases, the TR was simulated as 3 ms and $\alpha$=45° flip angle. Each S$^5$FP train used 5 RF pulses for opening and closing subsequences ramping from 0° to $\alpha$ and from $\alpha$ to $\zeta$=90°, respectively.

For the S$^5$FP sequence, the response shown is the 12th TR of a 24 pulse train. Approximately on-resonance isochromats with precession frequencies satisfying $$(2k)2\pi - \pi < \Delta\omega TR < (2k)2\pi + \pi (k \in Z)$$

have a similar response profile to those of SSFP, whereas isochromats with precession frequencies in the range $$(2k+1)2\pi - \pi < \Delta\omega TR < (2k+1)2\pi + \pi (k \in Z)$$

are significantly suppressed, with additional suppression being provided by RF spoiling.

FIGS. 6A and 6B present simulated and experimental data investigating the effects of RF spoiling and the final water-fat separation angle ($\zeta$). Each row of data (from top to bottom) within an image represents the |Mxy| response for successive TRs to a 24 TR length S$^5$FP train. The |Mxy| response is shown in image format for each TR of a $\alpha$=45° flip-angle, 24 TR length train including opening and closing subsequences of 5 TRs each, with resealing of data collected during the closing subsequence. From top to bottom are shown: (1) $\alpha$=$\zeta$=45°, without RF spoiling between trains; (2) $\alpha$=$\zeta$=45°, with RF spoiling; (3) $\alpha$=90°, $\zeta$=45°, without RF spoiling; and (4) $\alpha$=90°, $\zeta$=45°, with RF spoiling.

There is remarkably good agreement between simulation results shown (FIG. 6A) and corresponding experimental data (FIG. 6B). The inclusion of RF spoiling in the sequence provided significant additional suppression and also yielded a much smoother response in the stopband ($-3\pi < \Delta\omega TR < -\pi$). The use of a closing sequence to increase the water-fat separation angle from $\alpha$=45° to $\zeta$=90° provided further suppression of the unwanted spectral band while leaving the passband ($-\pi < \Delta\omega TR < \pi$) essentially unaffected.

Figures 7A, 7B:
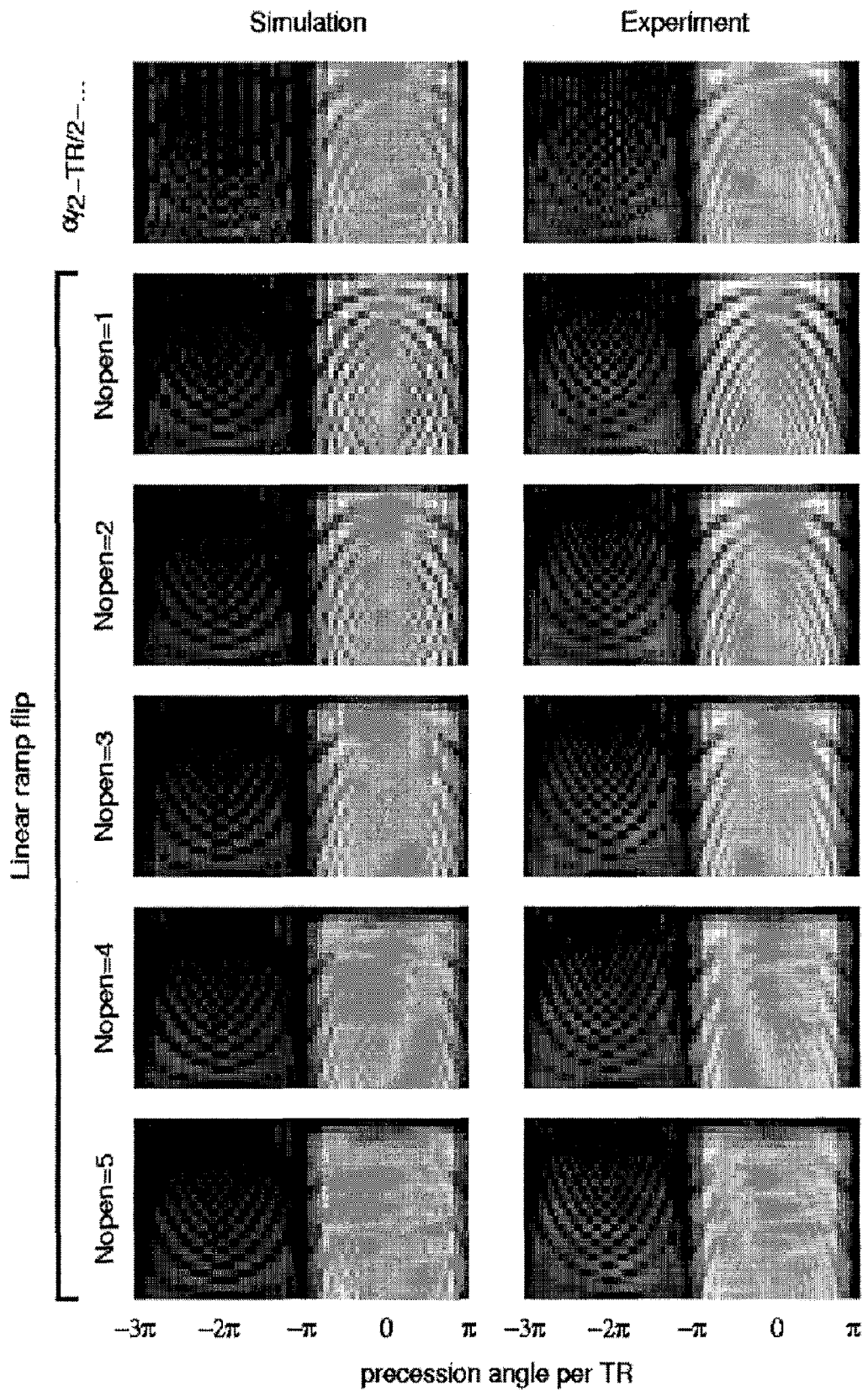
FIGS. 7A and 7B provide a comparison of simulated and experimental response data.
Figure 8A:
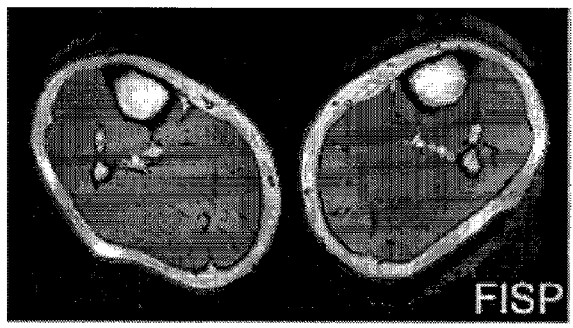
FIGS. 8A-F provide a comparison of calf images acquired using conventional FISP and S$^5$FP sequences with various water-fat separation angles.
Figure 8B:
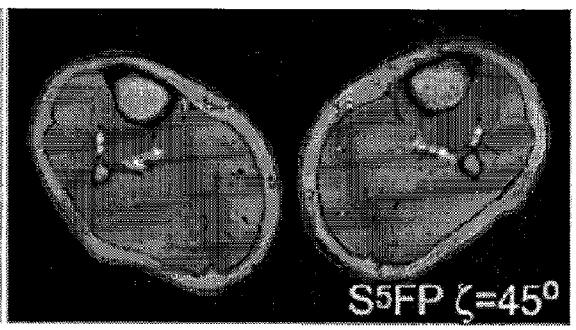
Figure 8C:
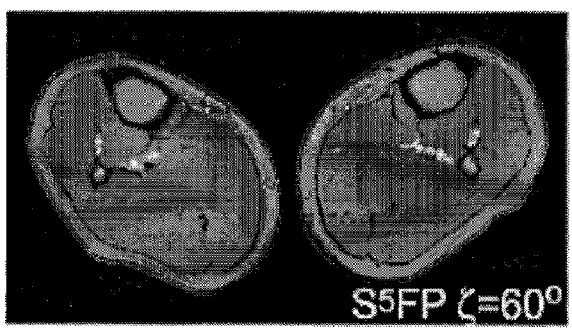
Figure 8D:
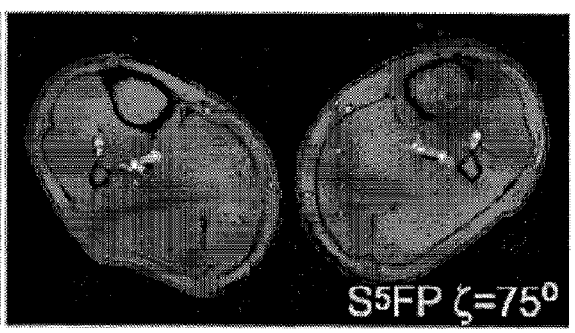
Figure 8E:
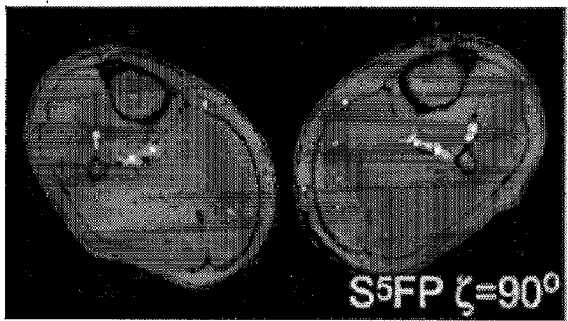
Figure 8F:
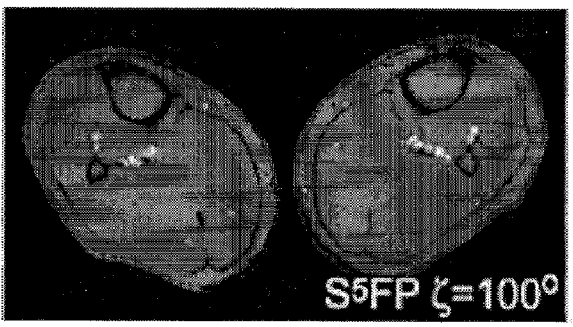

FIGS. 7A and 7B present simulated and experimental results on the choice of opening subsequences. Each row of data within an image represents the $M_{xy}$ response in successive TRs to a 24 TR length S$^5$FP train obtained with flip angle $\alpha$=45°, $\zeta$=90°, $N_{close}$=1, and RF spoiling between trains. As shown, there is excellent agreement between simulation (FIG. 7A) and experimental data (FIG. 7B). From top to bottom are shown: (1) the response to the conventional $\alpha$/2-TR/2 sequence; and (2)-(6) the responses to a linearly ramped flip angle open subsequence of $N_{open}$=1-5 RF pulses, respectively. Data acquired during the opening subsequences are shown in the first few TRs of each plot without resealing. As expected, the smoothness of the passband improves with longer opening subsequences, and there is little change in the appearance of the stop band. Note also that the conventional $\alpha$/2-TR/2 opening sequence gives a passband response approximately as smooth as the $N_{open}$=3 sequence, but with slightly more noisy stopband.

Thus, it may be seen that the opening subsequence significantly affects the response data for the entire SSFP-train. Furthermore, a smooth opening sequence is advantageous because the efficiency of the sequence is directly related to the ability to acquire data during the return to steady-state. As the opening subsequence length increases, the smoothness of the passband also increases, with little change in the appearance of the stop band. Using $N_{open}=5$ RF pulses provides an excellent response. The conventional $\alpha/2$-TR/2 catalyzing subsequence provides a passband performance similar to the linearly ramped, 3 RF pulse, full-TR method, although the stopband appears to have a more noisy appearance than for any of the full-TR opening subsequences.

Similar correspondence between simulations and experiments was obtained for the various other tests described above. The specific number of closing pulses did not appear to have a significant impact on either the effectiveness of the spoiling or the transient behavior during the train. In particular, use of $\zeta=90°$, $N_{close}=1$ pulse closing sequence (flip$_{close}=(\alpha+\zeta)/2$) provided a very similar response to those obtained with as many as 5 closing RF pulses. Using a single closing RF pulse has additional benefits: reduced SAR; reduced exposure to T2 relaxation; and avoids having to rescale the closing sequence data.

FIGS. 8A-8F provide a comparison of calf images acquired using conventional FISP and S$^5$FP pulse sequences with various water-fat separation angles, $\zeta$. The S$^5$FP images employed a train length of 24 TRs including $N_{open}=5$ and $N_{close}=1$ pulse subsequences, respectively, and RF spoiling between successive SSFP trains. The inherent fat suppression provided by the S$^5$FP sequence is readily apparent in both the sub-cutaneous and bone marrow tissues and is seen to increase as $\zeta$ increases. The muscle and blood tissues are relatively unaffected.

Figure 9:
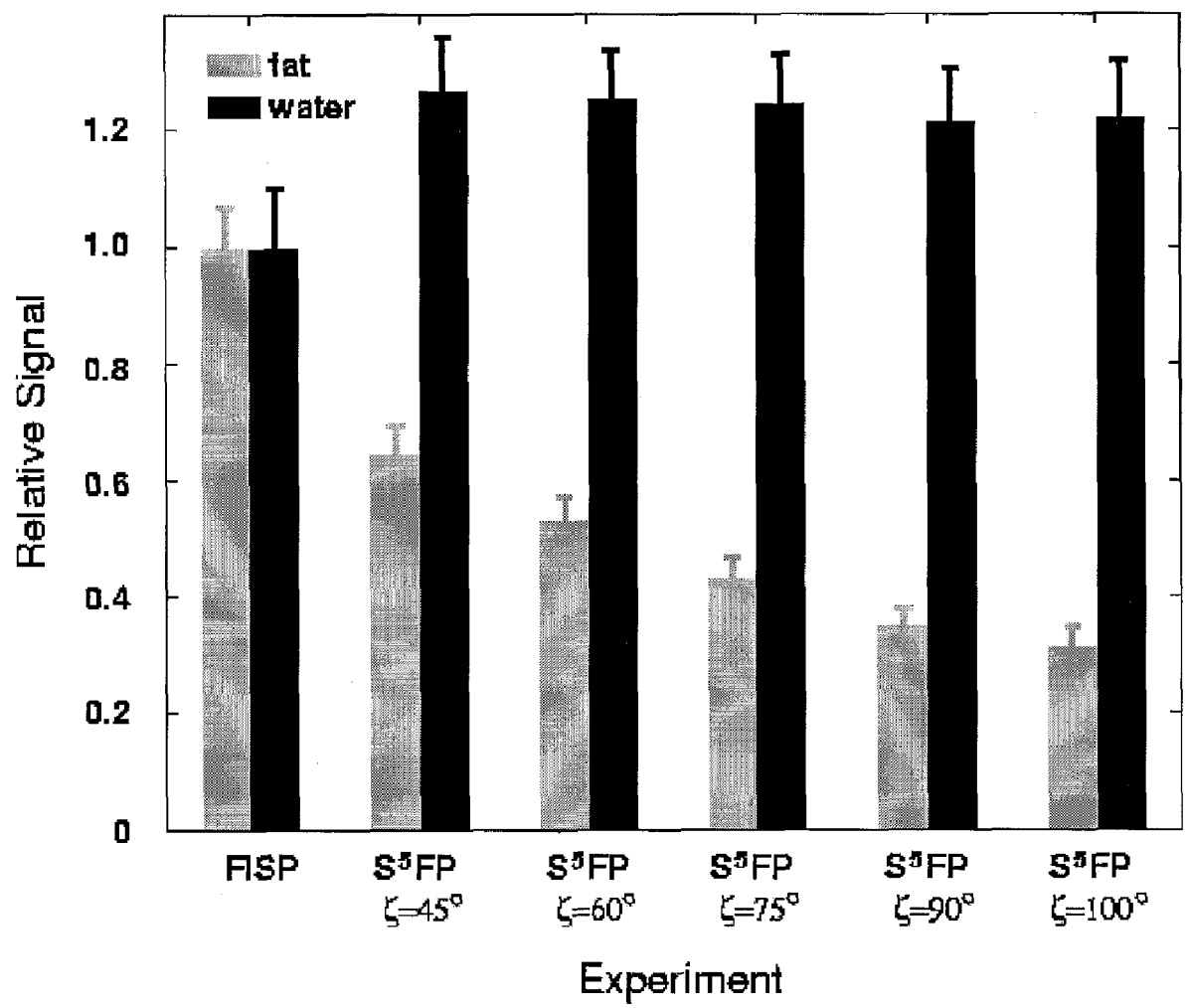
FIG. 9 provides a comparison of signal levels from ROIs in the calf images displayed in FIGS. 8A-F.

FIG. 9 provides a comparison of signal levels from ROIs in the calf images provided in FIGS. 8A-8F, comprising fat and water based tissue types acquired using conventional FISP and S$^5$FP pulse sequences for various values of water-fat separation angle, $\zeta$. The results provided in FIG. 9 clearly demonstrate that attenuation of the fatty tissues increases with $\zeta$ as predicted by theory. Furthermore, subcutaneous fat behaves similarly to the bone marrow in this respect, while the water-based muscle tissue signal remains constant, independent of $\zeta$. An increase muscle tissue signal level was, however, seen for all the S$^5$FP based images versus that for the FISP image. This might be due to the suppression of small phase-opposed signal contributions from fat within the muscle.

FIGS. 10A-10F provide a comparison of calf images acquired using conventional FISP and S$^5$FP pulse sequences with various train-lengths. The S$^5$FP images employed opening and closing subsequences of $N_{open}=5$ pulses and $N_{close}=1$ pulse, respectively, a water-fat separation angle $\zeta=90°$, and RF spoiling between successive SSFP trains. Again, the fat suppression provided by the S$^5$FP sequence is readily apparent and improves as the train-length decreases.

Figure 11:
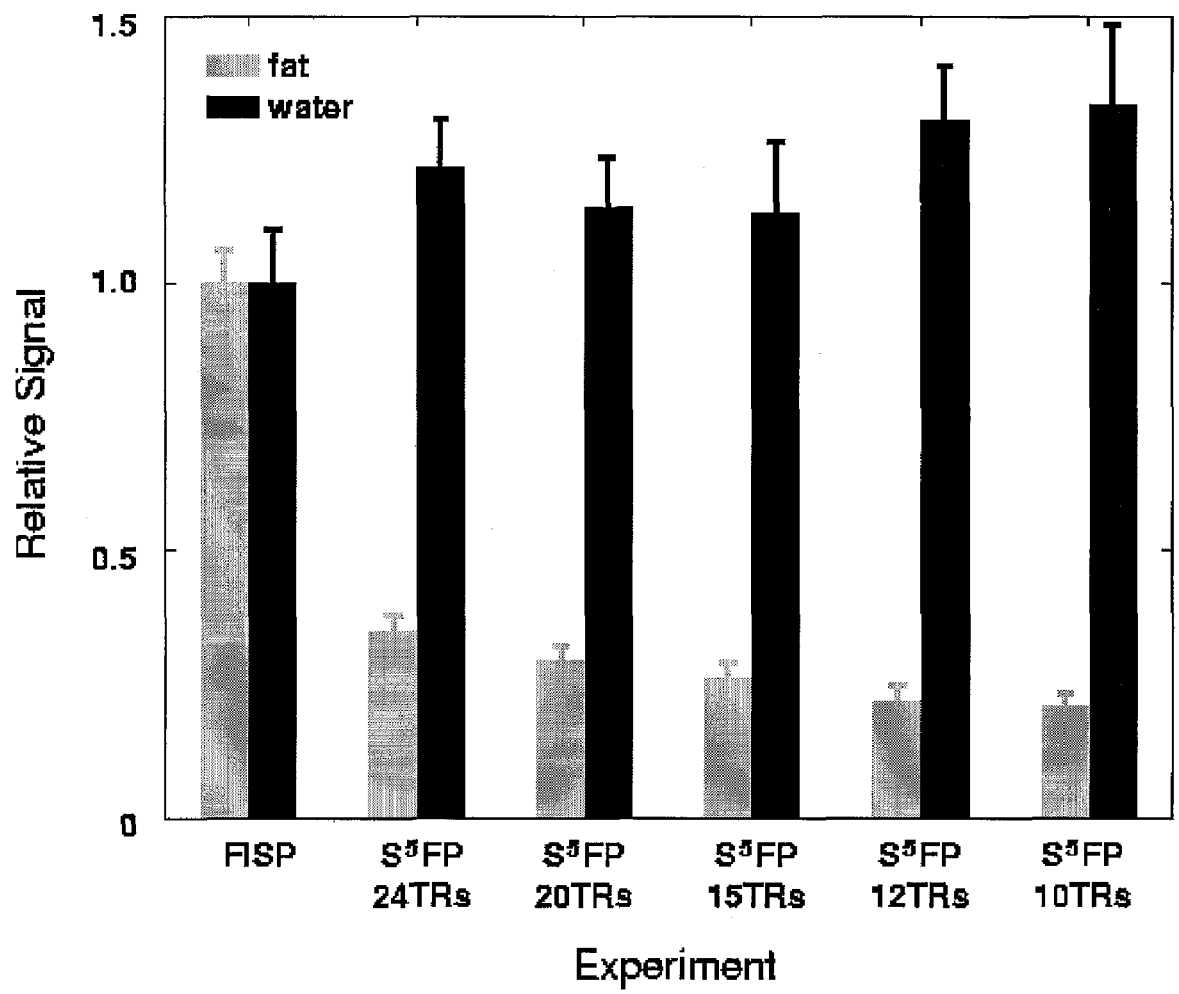
FIG. 11 provides a comparison of signal levels from ROIs in the calf images displayed in FIGS. 10A-F.
Figures 12A, 12B:
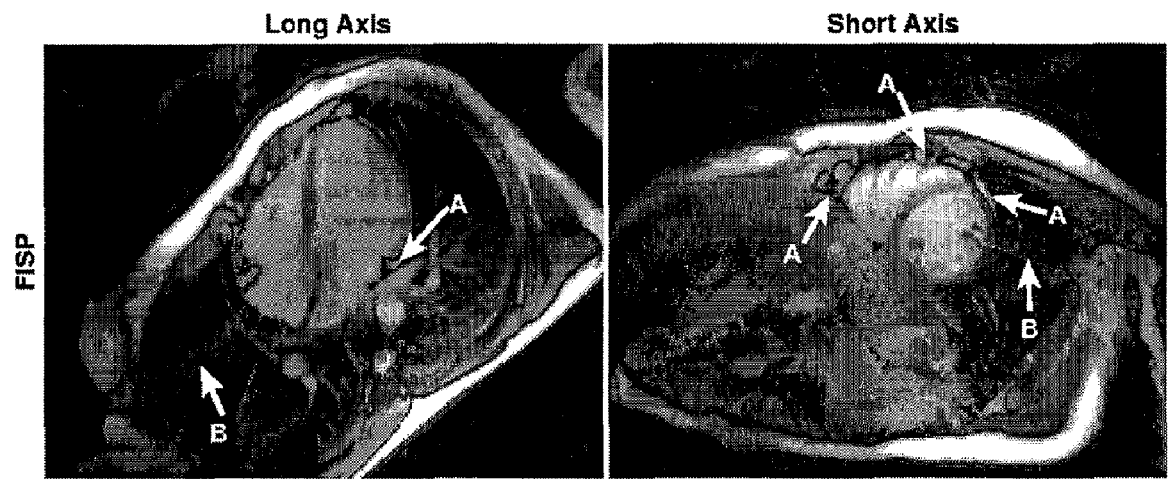
FIGS. 12A-D provide a comparison of calf images acquired using conventional FISP and S$^5$FP sequences.
Figures 12C, 12D:
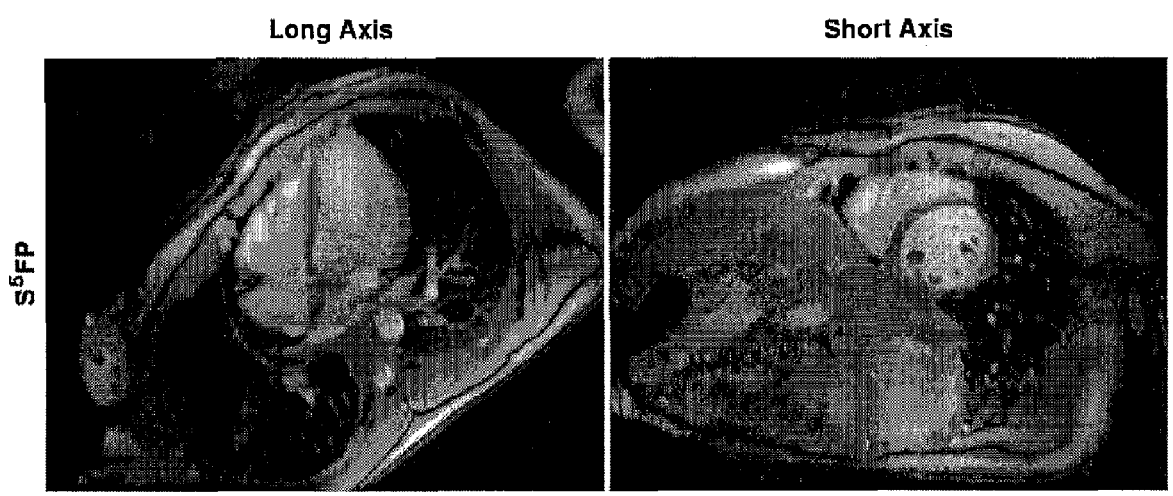

FIG. 11 provides a comparison of signal levels from ROIs in the calf images provided in FIGS. 10A-10F, comprising fat and water based tissue types acquired using conventional FISP and S$^5$FP pulse sequences with various durations of the short-train sequence. The ROI signal analyses from the images demonstrate that the attenuation of the fat-tissues improves for shorter pulse trains. The signal level of the water-based muscle tissue remains relatively constant, independent of the train-length at a slightly elevated signal level to that measured in the conventional FISP image.

Examples of the S$^5$FP method applied to TSENSE rate R=4 accelerated, ungated, continuous cardiac imaging are shown in FIGS. 12A-12D using conventional FISP (top) and S$^5$FP (bottom). Though there is some variation in the fat signal level due to field non-uniformity, significant fat suppression is seen throughout the S$^5$FP images. In particular, excellent suppression was achieved for pericardial fat in the regions labeled A. Artifacts from imperfect TSENSE reconstruction labeled B in the FISP images are not visible in the S$^5$FP images.

Thus, for both long axis (left) and short axis (right) image sets, the S$^5$FP images exhibit a significant fat suppression relative to the FISP images. Furthermore, continuous fat suppression was achieved at a constant level throughout the time-series of images. The degree of fat suppression varies spatially due to regional field inhomogeneities throughout the chest cavity. Note that the scanner's standard preparatory autoshim procedure was used for these acquisitions and no other special effort was made to shim the subject.

TSENSE reconstruction errors, visible as ghosting of the chest wall, in the conventional FISP images are greatly suppressed in the S$^5$FP acquisitions. The S$^5$FP acquisition improves the TSENSE reconstruction in two ways: fat suppression helps avoid signal nulls in the $B_1$ reference maps due to fat-water cancellation and also because the fat in the chest wall, which is the predominant artifact source, is itself suppressed.

The effects of S$^5$FP imaging are modelled as a filter with a periodic-in-frequency transfer function that comprises passbands, transition bands, and stopbands of equal width, 1/(2 TR). Here, 180° phase alternation of successive RF pulses (including the z-store pulse) fixes the scanner center frequency at the center of a S$^5$FP spectral passband. In an alternative implementation, with no RF pulse alternation except a 90° phase shift of the final water storage pulse, the response is shifted so that the scanner center frequency lies in a transition band. The spectral bandwidth selected or rejected by the sequence depends inversely on TR. Ideally, the spectral separation of the S$^5$FP passband and stopband would be the same as the fat-water frequency shift: i.e., approximately 214 Hz at 1.5 T, corresponding to an ideal TR=4.7 ms; or 428 Hz at 3 T corresponding to an ideal 2.3 ms. In practice, the fat and water spectral peaks may not fall at ideal locations in the S$^5$FP response. For a given TR, it is usually advantageous to adjust the scanner center frequency so that the water and fat spectral peaks placed symmetrically with respect to the transition band within a passband and stopband respectively.

At 1.5 T, fat isochromats are phase opposed to water for 2.3 ms<TR<7.0 ms: sufficient for high resolution imaging with up to 3 gradient recalled echo acquisitions with 256 samples and as many as 7 echo acquisitions with 128 samples. TRs in the range 11.7 ms<TR<16.4 ms should also show fat suppression, but such long TRs are likely to generate off-resonance artifacts. At 3 T, fat will be in the phase-opposed band for TRs in the range 1.2 ms<TR<3.5 ms, and also for 5.8 ms<TR<8.2 ms which might be useful for spiral-based FISP sequences.

SSFP-train length is an important parameter for the method, although the duration is of greater importance than the particular number of TRs in the train. The train should be short enough for gradient and RF-spoiling to be effective (i.e., duration$\lesssim T_2$ fat); and yet long enough for the SSFP condition to develop well-formed echoes with fat phase-opposed to water before next closing sequence. Better suppression was achieved when the closing RF pulse was increased towards $\zeta=90°$, although no apparent improvement was found by gradually ramping the flip angle over the last few RF pulses of the train.

The acquisition data during the opening and closing sequences (as described in the theory section) significantly reduces the overhead of the method to as little as 1 TR: i.e., a TR/2 delay until echo formation, the Z-storage RF pulse, and a gradient crusher. Without data resealing, the variation of the angle between the magnetization and the z-axis would yield a modulation of the acquired data. Data resealing corrects this, but also affects noise level during the opening and closing sequences. Note that in an interleaved phase encoding scheme, the resealed data would only affect the high spatial frequencies. The data resealing method may also be applied to other SSFP sequences employing the linear ramped flip subsequence.

The method works extremely well with continuous, ungated, and real-time imaging methods. Depending on the number of phase encoding steps required, each full image dataset can be acquired using just one, or several interleaved, SSFP-trains. This acquisition scheme has also been shown to be useful for TSENSE accelerated imaging. Fat suppression is maintained at a continuous level throughout the time-series of images, avoiding the artifacts associated with the fat-recovery that result from the sporadic application of fat saturation pulses.

The $S^5FP$ method is effective for sequences which repeatedly sample the center of k-space during the imaging process (e.g., projection reconstruction and spiral imaging). A conventional fat-sat method, which only saturates the fat infrequently, can generate artifacts because fat recovery during subsequent imaging causes amplitude and phase discontinuities near the center of k-space. The time-efficiency of $S^5FP$ allows more frequent application, providing more consistent amplitude and phase from fat signals.

Most traditional fat suppression methods assume that the water and fat magnetization are not initially distinct, and rely on them evolving differently, either by precessional frequency (chemical-shift) or $T_1$ relaxation time, to effect suppression. A chemically selective RF pulse is usually of fairly significant duration (typically ~10 ms for a 1.5 T system), so fat saturation may be performed infrequently, allowing significant fat magnetization regrowth during subsequent imaging. Implementation during FISP also necessitates a lengthy interruption of the SSFP process, requiring additional start-up time to re-establish the SSFP steady state. Inversion pulses can also be employed to null the fat signal, but are only effective at a specific evolution time and cannot be used for continuous suppression.

Methods have recently been proposed for SSFP specific spectral separations. The FEMR and LC-SSFP techniques proposed by Vasanawala use phase-cycling to manipulate the SSFP spectral response into a filter with well-defined pass and stop frequency bands. For suitable TRs, water and fat can be placed into the appropriate bands providing spectrally selective images. Hardy et al. propose similar schemes based on cycling the RF flip angle. Overall et al. provide a generalized approach based on the Shinnar-Le Roux algorithm for methods based on periodic cycling of RF amplitude and phase. The multi-point Dixon method for FISP, recently proposed by Reeder et al., is based on acquiring data at 3 or more TEs. It provides a fat-water separation method that is robust to $B_0$ inhomogeneity, but requires the an extended TR, which may itself be an artifact source. The main drawback of these methods is that the imaging time is increased by the order of the phase cycling scheme with a corresponding loss of temporal resolution and/or increased scanning time.

Hargreaves proposed a method for fat-water separation which requires no additional overhead: it simply labels voxels as fat if they are negative in a phase-sensitively reconstructed dataset. The method is simple to implement, but suffers the drawback that each voxel is identified as being either wholly water or fat. The issue of how to assign voxels containing partial volumes of water and fat and the problems caused by destructive interference and resulting signal dropout remain.

Recently, Santos et al proposed a method for continuous fat saturation with real-time SSFP imaging which also employs short SSFP-trains. However, that method attempts to z-store both components of the magnetization at the end of the train by playing an $\alpha/2$ pulse after a full TR: i.e., relinquishing the inherent spectral selection provided by the SSFP. Instead, spectral selection is then achieved using an explicit $(+90°)$-TE-$(-90°)$ combination to impart a sinusoidal weighting in Mz according to the resonant offset frequency: repeated inversions causing saturation of the unwanted spectral component. In contrast, $S^5FP$ exploits the inherent spectral selection of SSFP sequence to select the spectral band for spoiling. Nonetheless, these two methods may be combined by simply inserting a $(+90°)$-TE-$(-90°)$ sequence between the SSFP-trains, possibly providing additional suppression, at the expense of increased interruption to the SSFP sequence.

The $S^5FP$ method suppresses magnetization in particular off-resonance frequency bands. For the purposes of fat suppression, off-resonance is assumed to be caused by chemical shift. The sequence does not distinguish between chemical shift and off-resonance from other sources such as $B_0$ inhomogeneity. In this respect it is similar to the majority of fat suppression methods relying on chemical shift for selection or suppression including: conventional chem-sat pulses, the LC-SSFP and FEMR methods, the phase-sensitive SSFP reconstruction method, and the real-time method of Santos. Furthermore, frequency pass-and stopbands generated by the $S^5FP$, LC-SSFP, FEMR, and phase sensitive SSFP methods are directly related to the SSFP TR parameter, which may require some tuning for various $B_0$ field strengths. In contrast, the multi-point Dixon method, while chemical-shift based, avoids this inhomogeneity problem by implicitly measuring the local field inhomogeneity as part of the imaging process.

Thus, it has been demonstrated a simple modification to the FISP imaging sequence that efficiently provides fat-suppression while avoiding a lengthy interruption in the SSFP steady state for an explicit fat-saturation sequence. In particular, it has been shown that the SSFP sequence underpinning FISP partitions the magnetization into two spectral groups (i.e., positive and negatively phased echoes) at the TE=TR/2 timepoint. For common imaging TRs, water and fat fall into different groups permitting an efficient fat suppression and avoiding the need for an additional evolution time to separate the species. $S^5FP$ provides effective suppression of a range of frequencies of bandwidth 1/TR adjacent to a passband of approximately the same size. The method is robust and straightforward to implement on 1.5 T scanners, and should also be applicable at 3 T.

What is claimed:

1. A method for fat-suppressed imaging, the method comprising:
   storing a first spectral component of an echo signal formed at TR/2 from a sample;
   suppressing a second spectral component of the echo signal at TR/2;
   re-exciting the stored spectral component after suppressing the second spectral component; and
   producing an image of the sample based on the re-excited stored spectral component.

2. The method of claim 1, wherein at least one of the first and second spectral components corresponds to at least one of water, fat, muscle, and blood.

3. The method of claim 1, further comprising:
   transmitting to the sample a z-storage pulse having a flip-angle adapted to rotate the first spectral component by a predefined angle.

4. The method of claim 3, wherein the z-storage pulse excites the second spectral component toward a plane that is transverse to a plane of the first spectral component.

5. The method of claim 1, further comprising:
   exciting the sample with RF pulses so as to produce the first spectral component and the second spectral component of the echo signal, where the first and second spectral components correspond to different materials.

6. The method of claim 5, wherein the second spectral component corresponds to fat.

7. The method of claim 1, wherein the first spectral component has one of a positive or negative echo signal and the second spectral component has the other of the positive or negative echo signal.

8. The method of claim 1, further comprising:
   exciting the sample with RF pulses so the first spectral component has one of a positive or negative echo signal and the second spectral component has the other of the positive or negative echo signal.

9. The method of claim 4, further comprising:
   gradient crushing the transverse component of the second spectral component.

10. The method of claim 9, further comprising:
    applying a closing subsequence including $N_{close}$ RF pulses that is arranged so as to gradually increase the separation angle of the first and second spectral components.

11. The method of claim 9, further comprising
    applying RF spoiling to further suppress the second spectral component.

12. The method of claim 10, further comprising:
    applying an opening subsequence, one of before or with said re-exciting, so as to separate the first and second components into in-phase and phase-opposed echoes.

13. The method of claim 1, further comprising:
    applying an opening subsequence, one of before or with said re-exciting, so as to separate the first and second components into in-phase and phase-opposed echoes.

14. The method of claim 1, further comprising:
    separating the first and second components into in-phase and phase-opposed echoes.

15. A method for fat-suppressed MRI imaging, the method comprising:
    applying an RF pulse sequence to a sample, the RF pulse sequence be arranged so that a first spectral component of an echo signal forms at TR/2 from the sample and so that a second spectral component of the echo signal forms at TR/2 from the sample, where the second spectral component corresponds to fat;
    storing the first spectral component;
    suppressing the second spectral component;
    re-exciting the stored spectral component using the RF pulse sequence after suppressing the second spectral component; and
    producing an image of the sample based on the re-excited stored spectral component.

16. The method of claim 15, further comprising:
    transmitting a z-storage pulse having a flip-angle adapted to rotate the first spectral component by a predefined angle to the sample; and
    wherein the z-storage pulse excites the second spectral component such that it moves toward a plane that is transverse to a plane of the first spectral component.

17. The method of claim 4, further comprising:
    gradient crushing the transverse component of the second spectral component; and
    applying RF spoiling to further suppress the second spectral component.

18. The method of claim 9, wherein said pulse sequence further includes
    a closing subsequence including $N_{close}$ RF pulses that are arranged so as to gradually increase the separation angle of the first and second spectral components; and
    an opening subsequence so as to separate the first and spectral second components into in-phase and phase-opposed echoes.

* * * * *